United States Patent
Tsunoi

(12) 
(10) Patent No.: US 6,429,516 B1
(45) Date of Patent: *Aug. 6, 2002

(54) STRUCTURE FOR MOUNTING A BARE CHIP USING AN INTERPOSER

(75) Inventor: Kazuhisa Tsunoi, Kawasaki (JP)

(73) Assignee: Fujitsu, Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/966,753

(22) Filed: Nov. 10, 1997

(30) Foreign Application Priority Data

Feb. 28, 1997 (JP) .............................. 9-046247

(51) Int. Cl.⁷ .............................................. H01L 23/48
(52) U.S. Cl. ....................... 257/737; 257/775; 257/780; 257/783; 228/180.22; 361/773; 361/774
(58) Field of Search ........................... 438/108, 14, 15, 438/18, 613, 612; 257/756, 778, 738, 737, 774, 700, 773, 775, 780, 782, 783, 786; 29/843, 840; 228/180, 22; 361/772, 773, 774

(56) References Cited

U.S. PATENT DOCUMENTS

| | | | | |
|---|---|---|---|---|
| 5,065,227 A | * | 11/1991 | Frankeny et al. ............ | 257/700 |
| 5,195,237 A | * | 3/1993 | Cray et al. .................... | 29/843 |
| 5,289,631 A | * | 3/1994 | Koopman et al. ............. | 438/14 |
| 5,478,007 A | * | 12/1995 | Marrs .......................... | 438/613 |
| 5,489,804 A | * | 2/1996 | Pasch ........................... | 438/108 |
| 5,530,288 A | * | 6/1996 | Stone ........................... | 257/738 |
| 5,574,630 A | * | 11/1996 | Kresge et al. ................ | 361/792 |
| 5,640,051 A | * | 6/1997 | Tomura et al. ............... | 257/778 |
| 5,691,041 A | * | 11/1997 | Frankeny et al. ............. | 257/727 |
| 5,742,100 A | * | 4/1998 | Schroeder et al. ........... | 257/737 |
| 5,783,865 A | * | 7/1998 | Higashiguchi et al. ....... | 257/774 |
| 5,789,930 A | * | 8/1998 | Isaacs et al. .................. | 438/15 |
| 5,814,889 A | * | 9/1998 | Gual ............................ | 257/774 |
| 5,848,466 A | * | 12/1998 | Viza et al. ..................... | 29/840 |
| 5,859,470 A | * | 1/1999 | Ellerson et al. .............. | 257/778 |
| 5,874,780 A | * | 2/1999 | Murakami .................... | 257/738 |
| 5,883,438 A | * | 3/1999 | Kang ............................ | 257/738 |
| 5,889,326 A | * | 3/1999 | Tanaka ........................ | 257/738 |

FOREIGN PATENT DOCUMENTS

| | | | |
|---|---|---|---|
| EP | 186818 | * | 7/1986 |
| EP | 810649 | * | 12/1997 |
| JP | 63-266861 | | 11/1988 |
| JP | 2-96343 | * | 4/1990 |
| JP | 4-124845 | | 4/1992 |
| JP | 10-32070 | * | 2/1998 |

* cited by examiner

*Primary Examiner*—David L. Talbott
*Assistant Examiner*—Alonzo Chambliss
(74) *Attorney, Agent, or Firm*—Armstrong, Westerman & Hattori, LLP

(57) ABSTRACT

A bare chip mounting structure includes a bare chip having inlet or outlet terminals, an interposer having openings at positions corresponding to said inlet or outlet terminals of the bare chip and a circuit board having conductive pads wherein the bare chip is mounted on the circuit board by means of the interposer in such a manner that the inlet or outlet terminals are electrically connected to the conductive pads of the circuit board through the openings of the interposer.

4 Claims, 5 Drawing Sheets

STRUCTURE FOR MOUNTING A BARE CHIP USING AN INTERPOSER

BACKGROUND OF THE INVENTION

1. Field of the Invention

The present invention relates to a method and a structure for mounting a bare chip and, more particularly, to bare chip mounting method and structure in which a bare chip can easily be removed from a circuit board, if such a bare chip is an unacceptable one, by disposing an interposer between the bare chip and the circuit board when the bare chip is to be mounted on the circuit board. The present invention also relates to bare chip mounting method and structure in which electrical characteristics of the bare chip can easily be examined before such a bare chip is mounted on the circuit board.

2. Description of the Related Art

In a conventional method or structure for mounting a bare chip on a circuit board, if it is found that the bare chip is unacceptable after it is mounted, it is necessary to remove the bare chip from the circuit board and to change it for a new one. However, when the bare chip is changed, the circuit board is sometimes damaged by the changing operation and sometimes the circuit board can no longer be used.

For example, as shown in FIG. 4(a), Japanese Unexamined Patent Publication No. 3-19251 discloses a bare chip mounting structure in which a bare chip 3 is first mounted on predetermined conductive electrodes 2 of a circuit board 1 by a face-down bonding using a solution conductive adhesive containing two solutions having different glass transition points and then one of the solutions in the solution conductive adhesive having a lower glass transition point is evaporated by any method, such as heating or the like.

As shown in FIG. 4(b), as time passes, the contact resistance of the bare chip 3 is reduced as the solution in the solution conductive adhesive is evaporated and, when the time has expired at T, the electrical resistance becomes constant. After that, the bare chip 3 is subjected to an electrical examination and, if any unaccepted bare chip is found, such a bare chip is removed from the circuit board 1, so that only an acceptable bare chip is finally mounted and secured on the circuit board by finally curing the solution conductive adhesive.

In this bare chip mounting method, however, since the bare chip 3 is adhered only to the electrodes 2 by means of the conductive adhesive 4, the strength of mounting is not at a reliable level, although the bare chip 3 can easily be removed if it is found to be an unacceptable one.

Another bare chip mounting structure is disclosed in Japanese Unexamined Patent Publication No. 6-69280 in which, as shown in FIG. 5(a), a thermosetting palladium conductive resin material is coated on pads 5 arranged on a circuit board 1 using a mask and the thermosetting palladium conductive resin material is then cured by heating to form bumps 6.

Then, as shown in FIG. 5(b), a thermosetting synthetic resin 7a which is in state of gel at room temperature is attached to the surfaces where the pads 5 are arranged and the electrodes 3a of the bare chip 3 are positioned with respect to the bumps 6. Then, the bare chip 3 is pushed in the direction indicated by an arrow B and heated, for example, to a temperature of 110 to 150° C. in such a manner that, as shown in FIG. 5(c), the gel-like synthetic resin 7a is cured to form an insulating layer 7 and thus the bare chip 3 is rigidly secured to the circuit board 1 and the bumps 6 are simultaneously attached to the pads, so that the bare chip 3 is finally mounted on the circuit board 1.

The bare chip 3 is subjected to an examination for electrical characteristics. If the bare chip 3 is unacceptable, it can easily be removed from the circuit board, for example, by heating the circuit board to a temperature of 150 to 200° C. which is higher than the above-mentioned heating temperature to soften the insulating layer 7.

In this bare chip mounting method, the examination for electrical characteristics is usually performed after the bare chip is mounted on the circuit board. However, such an examination can also be performed, for a bare chip itself, before the bare chip is mounted on the circuit board. In this case, in the conventional testing device for electrical properties of the bare chip, as shown in FIG. 6, a plurality of probe pins 8 must be guided so as to be in conformity with the pitch of the electrodes of the bare chip. In still another prior art, a socket having contact pins which are arranged at the same pitch as that of the electrodes of the bare chip, is used.

In the above-mentioned bare chip mounting method described with reference to FIG. 6, since the probe pins are arranged so as to be in conformity with the pitch of the electrodes of the bare chip, the probe pins must be long and therefore a test for high frequency characteristics cannot be fully realized. In addition, a socket having contact pins which are arranged at the same pitch as that of the electrodes of the bare chip is expensive and a durability cannot be expected since the contact pins must be fine.

SUMMARY OF THE INVENTION

An object of the present invention is to provide a method and a structure, for mounting a bare chip on a circuit board, in which reliability is maintained and, on the other hand, changing of a bare chip can easily be carried out.

Another object of the present invention is to provide a method and a structure, for mounting a bare chip on a circuit board, in which an examination of the bare chip can easily be carried out before the bare chip is fixedly mounted on the circuit board.

According to the present invention, there is provided a bare chip mounting structure comprising: a bare chip having inlet or outlet terminals; an interposer having openings at positions corresponding to the inlet or outlet terminals of the bare chip; and a circuit board having conductive pads wherein the bare chip is mounted on the circuit board by means of the interposer in such a manner that the inlet or outlet terminals are electrically connected to the conductive pads of the circuit board through the openings in the interposer.

In one embodiment, each of the openings of the interposer has an inner wall thereof which is plated with an electrically conductive metal.

In another embodiment, each of the inlet or outlet terminals is a metal bump having at least two steps comprising a base portion having a larger diameter and a tip end portion having a smaller diameter.

In still another embodiment, the interposer has at least one pad for the purpose of testing and a lead line connecting the pad to the inlet or outlet terminal of the bare chip when the bare chip is mounted on the circuit board.

In further embodiment, a thermosetting resin adhesive is filled between the bare chip and the interposer and between the interposer and the circuit board.

According to another aspect of the present invention, there is provided with a method of mounting a bare chip on a circuit board, the method comprising the following steps of: adhering an interposer, having openings at positions corresponding to inlet or outlet terminals of the bare chip, to a circuit board having conductive pads in such a manner that the openings of the interposer are aligned with the conductive pads of the circuit board; and mounting the bare chip on the circuit board in such a manner that the inlet or outlet terminals of the bare chip electrically contact the conductive pads of the circuit board through the openings of the interposer.

In still another aspect of the present invention, there is provided a method for mounting a bare chip on a circuit board, the method comprising the following steps of: adhering an interposer, having openings at positions corresponding to inlet or outlet terminals of the bare chip and each of the openings having inner wall plated with electrically conductive metal, to a circuit board having conductive pads in such a manner that the openings of the interposer are aligned with the conductive pads of the circuit board;

mounting the bare chip on the circuit board in such a manner that the inlet or outlet terminals of the bare chip electrically contact the conductive pads of the circuit board through the openings of the interposer;

carrying out an electrical characteristic test on the bare chip; and filling a thermosetting resin adhesive between the bare chip and the interposer and between the interposer and the circuit board.

In further aspect of the present invention, there is provided a method, for mounting a bare chip on a circuit board, the method comprising the following steps of: adhering an interposer, having openings at positions corresponding to inlet or outlet terminals of the bare chip and having test pads connected to lead lines which extend to the respective openings, to a circuit board having conductive pads in such a manner that the openings of the interposer are aligned with the conductive pads of the circuit board; mounting the bare chip on the circuit board in such a manner that the inlet or outlet terminals of the bare chip electrically contact the conductive pads of the circuit board through the openings of the interposer; carrying out an electrical characteristic test on the bare chip by using the test pads of the interposer; and removing the test pads from the interposer.

According to a still another aspect of the present invention, there is provided an interposer adapted to be used for mounting a bare chip on a circuit board, the interposer comprising: an insulating plate having openings at positions corresponding to inlet or outlet terminals of the bare chip; the insulating plate also having such a thickness that, when the insulating plate is disposed between the bare chip and the circuit board, inlet or outlet terminals of the bare chip can be in contact with conductive pads of the circuit board through the openings of the interposer.

In one embodiment, each of the openings has an inner wall thereof and at least the inner wall is plated with an electrically conductive metal.

In another embodiment, the interposer has at least one pad for a purpose of test and a lead line connecting the pad to the plated conductive metal.

DETAILED DESCRIPTION OF THE EMBODIMENTS

Figure 1:
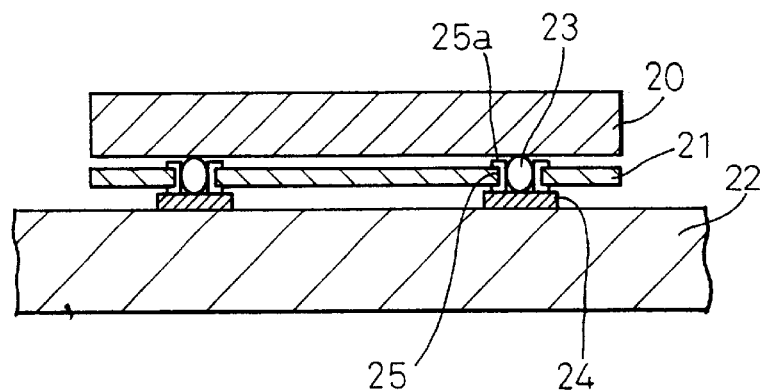
FIG. 1 is a cross-sectional view of a first embodiment of this invention.

In the drawings, FIG. 1 is a cross-sectional view of a first embodiment of a bare chip mounting structure of this invention. The structure includes a bare chip 20, an interposer 21 and a circuit board 22. The bare chip 20 is provided with bumps 23 at the inlet and outlet terminals and, on the other hand, the circuit board 22 is provided with electrically conductive pads 24. The interposer 21 is a thin insulating film having a substantially the same size as the bare chip 20 and a thickness smaller than the height of the bumps 23. The interposer 21 has holes or positions corresponding to the inlet and outlet terminals (bumps 23) of the bare chip 20. The inner surfaces of the openings 25 of the interposer 21 and the upper and lower surfaces of the interposer 21 in the vicinity of the openings 25 are plated with electrically conductive metal.

The interposer 21 is made of an organic material which can be drilled by a laser beam. For example, a polyester can be used. Particularly, a heat-resistant material, such as polyimide resin, glass-epoxy resin or the like, can be advantageously used as a material of the interposer 21 in consideration of the test in high temperature.

The interposer 21 is placed on the circuit board 22 so that the positions of the openings 25 correspond to the positions of the pads 24. The bare chip 20 is also placed thereon so that the bumps 23 are inserted into the openings 25. In this connection, the plated portions 25a provided on the inner surfaces of the openings 25 are in contact with the bumps 23 and, in addition, therefore firmly in contact with the pads 24 of the circuit board 22. Even if the height of the bumps 23 is somewhat small and, therefore, the bumps 23 cannot contact the pads 24, the bumps 23 can be electrically connected to the pads 24 through the plated portions 25a and therefore an electrical characteristic test can be carried out.

After the electrical characteristic test is completed, if the bare chip is accepted, a thermosetting resin is filled between the bare chip 20 and interposer 21 and between the interposer 21 and the circuit board 22 and then thermosetting resin is hardened by heating, so that the bare chip 20 is firmly attached to the circuit board 22. In this case, due to the shrinkage of the heated thermosetting resin, the connection between the bumps 23 and the pads 24 is more firmly attained. If the bare chip 20 thereafter becomes unacceptable, it is of course necessary to remove the bare chip 20 from the circuit board 22. In this case, in this embodiment, the bare chip 20 can be removed from the interposer 21 which is weaker in strength than the bare chip 20 or the circuit board 22, so that the bare chip 20 can be removed therefrom. Thus, the bare chip 20 and the circuit board 22 are prevented from being damaged. In this case, it is advantageous to reduce the strength of the thermosetting resin by heating the same. The bumps 23 remain on the bare chip 20 and therefore it is possible to carry out an analysis test of the unacceptable chip by contacting the probe pins with the bumps 23.

Figure 2A:
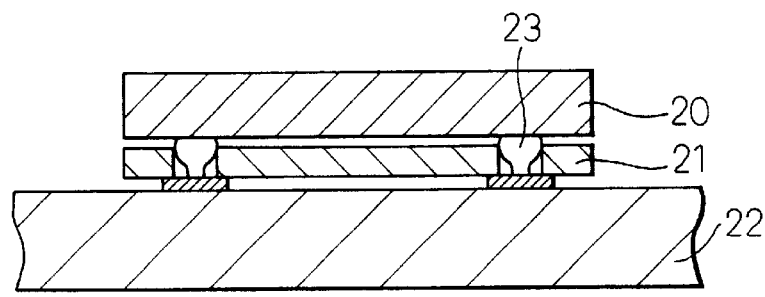
FIG. 2(a) is a cross-sectional view of a second embodiment of this invention and FIGS. 2(b) and 2(c) illustrate bump forming steps in this second embodiment.
Figure 2B:
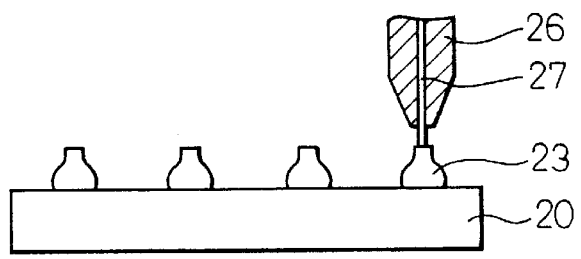
Figure 2C:
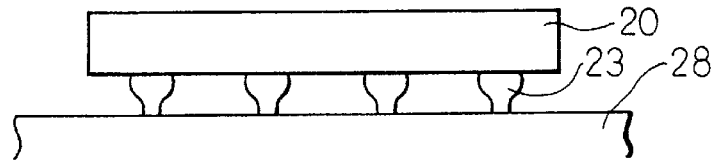

FIG. 2(a) is a cross-sectional view of a second embodiment of this invention and FIGS. 2(b) and 2(c) illustrate bump forming steps in this second embodiment. In this second embodiment, the bump 23 is a metal bump made of soft metal, such as gold, solder or the like and has a shape with at least two steps. The other structures are the same as those of the first embodiment. The shape of bumps having such steps can be formed by heating a gold wire 27 extruded from a capillary 26 to form a ball at the tip end of the gold wire which is pushed to the bare chip 20. Thereafter, the gold wire is pulled to be cut so that a bump 23 having two steps can be formed between the ball portion and the cut gold wire.

Then the bare chip 20 is turned upside-down and put on a glass plate 28, as shown in FIG. 2(c), and the bare chip 20 is slightly pushed against the glass plate 28 so that the heights of the respective bumps 23 become uniform. Then, in the same manner as the first embodiment, the bare chip 20 is mounted on the circuit board 22 by means of an interposer 21 disposed therebetween. In this case, according to this embodiment, since the diameter of the bump at the tip end thereof is smaller, the bare chip 20 can easily be inserted into the openings 25 of the interposer 21.

The openings 25 of the interposer 21 can accurately be formed by drilling with a laser beam, if the interposer 21 is made of an organic material.

Figure 3A:
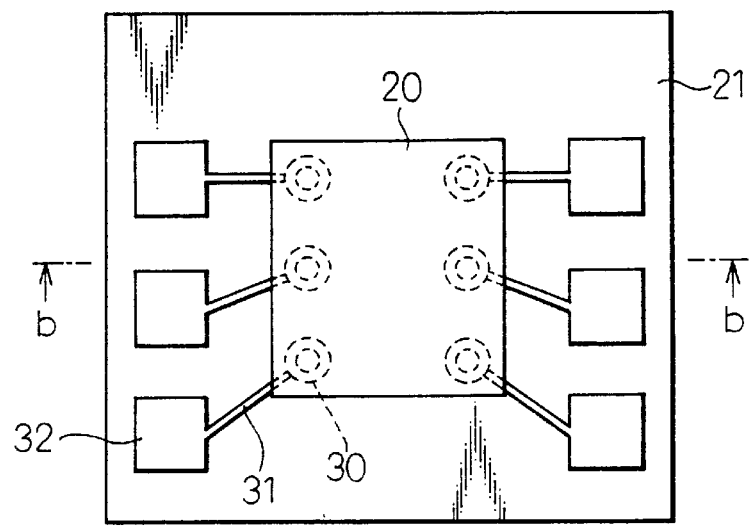
FIG. 3(a) is a cross-sectional view of a third embodiment of this invention and FIGS. 3(b) is a cross-sectional view taken along a line b—b in FIG. 3(a)
Figure 3B:
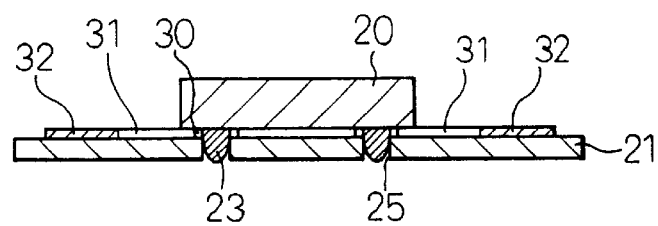
Figure 4A:
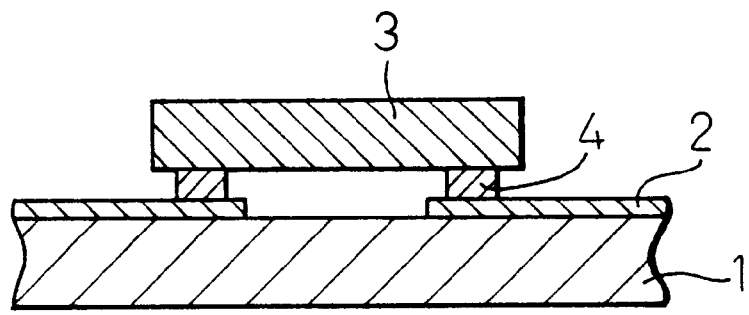
FIG. 4(a) is a cross-sectional view illustrating a bare chip mounting structure known in the prior art and FIG. 4(b) shows a resistance change with a curing time of the solvent type conductive adhesive consisting of two kinds of solvents.
Figure 4B:
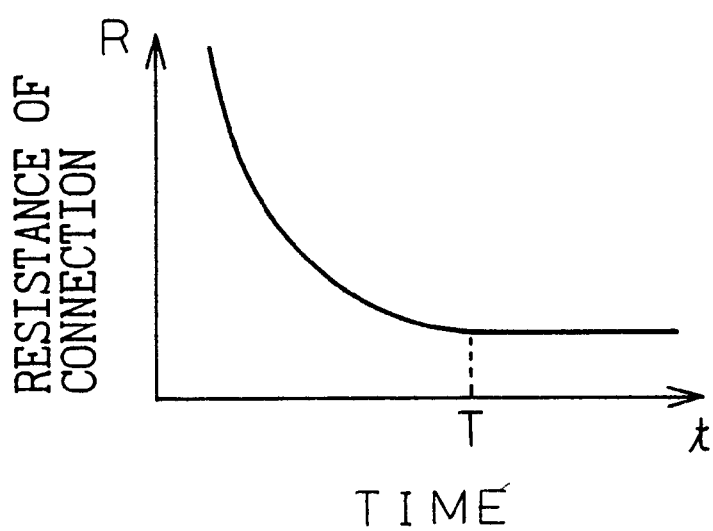
Figure 5A:
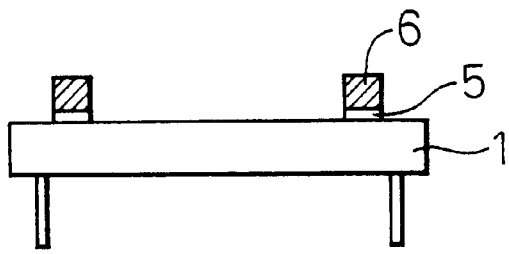
FIGS. 5(a), 5(b) and 5(c) are views illustrating bare chip mounting steps of another prior art.
Figure 5B:
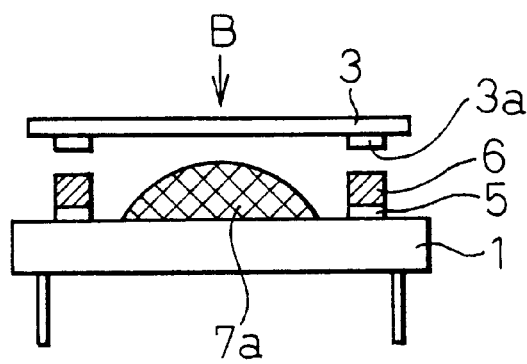
Figure 5C:
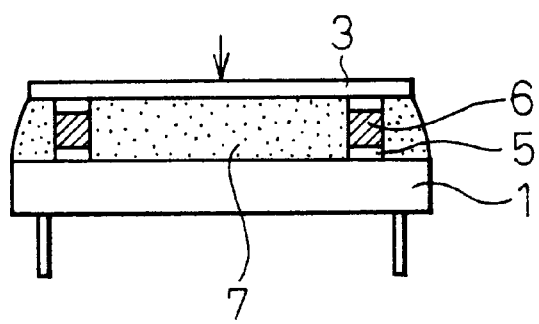
Figure 6:
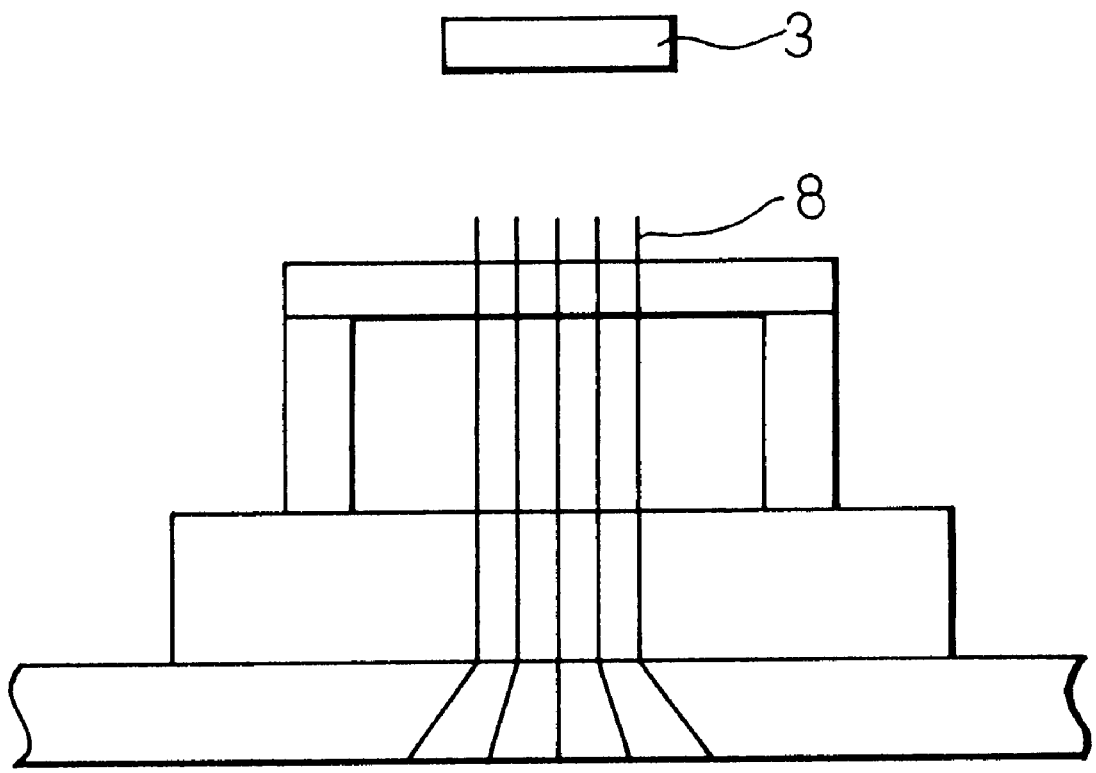
FIG. 6 is a view illustrating a bare chip testing apparatus known in the prior art.

FIG. 3(a) is a cross-sectional view of a third embodiment of this invention and FIG. 3(b) is a cross-sectional view taken along a line b—b in FIG. 3(a). In these drawings, the structure of this embodiment includes a bare chip 20 and an interposer 21. The bare chip 20 is provided with bumps 23 at the inlet and outlet terminals. The interposer 21 is a thin insulating film having a thickness smaller than the height of the bumps 23. The interposer 21 has openings 25 at the positions corresponding to the inlet and outlet terminals (bumps 23) of the bare chip 20, in the same manner as the first embodiment.

However, in this embodiment, the size of the interposer 21 is larger than that (the outer dimensions) of the bare chip 20, respective pads 30 are provided at the openings 25, and testing pads are provided thorough the lead lines 31 from the respective pads 30.

In this third embodiment, the bare chip 20 is put on the interposer 21 and pushed toward the latter. Therefore, the bumps 23 of the bare chip 20 come into contact with the pads 30 of the interposer 21. In this state, an electrical characteristic examination can be carried out by contacting the probe pins of the testing apparatus with the pads 32 for a purpose of test.

After the electrical characteristic test is completed, if it is found that the bare chip is an unacceptable one, the bare chip 20 can easily be removed from the interposer 21 by releasing the bare chip 20. If, after the electrical characteristic test, it is found that the bare chip 20 is an acceptable one, the bare chip 20 can be mounted on the circuit board 22 directly or after the part of the interposer which extends outward from the bare chip 20 is cut off. In this latter case, any interference between the other electronic elements mounted on the circuit board 22 and the bare chip 20 can be avoided, so that high-density mounting can be attained.

It should be understood by those skilled in the art that the foregoing description relates to only some preferred embodiments of the disclosed invention, and that various changes and modifications may be made to the invention without departing from the spirit and scope thereof.

What I claim is:

1. A bare chip mounting structure comprising:
   a bare chip having input or output terminals which are metal bumps with a step configuration having a base portion with a first diameter and a tip end portion with a second diameter, said second diameter being smaller than the first diameter;
   an interposer having openings at positions corresponding to said input or output terminals of the bare chip; and
   a circuit board having conductive pads wherein said bare chip is mounted on said circuit board by means of said interposer in a manner that said input or output terminals are directly electrically connected to said conductive pads of the circuit board through said openings of the interposer, wherein the smaller second diameter of the bump at the tip end ensures that said input or output terminals of the bare chip can easily be inserted into the openings of the interposer,
   wherein said interposer has a thickness less than a height of said input or output terminals and does not contact a surface of said circuit board.

2. A bare chip mounting structure as set forth in claim 1, wherein each of said opening of the interposer has an inner wall which is plated with an electrically conductive metal.

3. A bare chip mounting structure as set forth in claim 1, wherein said interposer has a surface area larger than a surface area of said bare chip said interposer having at least one test pad formed on the surface area of said interposer outside the surface area of said bare chip, and a lead line connecting the test pad to at least one of the input or output terminals.

4. A bare chip mounting structure as set forth in claim 1, wherein a thermosetting resin adhesive is filled between said bare chip and said interposer and between said interposer and said circuit board.

* * * * *

UNITED STATES PATENT AND TRADEMARK OFFICE
CERTIFICATE OF CORRECTION

PATENT NO.         : 6,429,516 B1  
APPLICATION NO. : 08/966753  
DATED                  : August 6, 2002  
INVENTOR(S)        : Kazuhisa Tsunoi Page 1 of 1

It is certified that error appears in the above-identified patent and that said Letters Patent is hereby corrected as shown below:

On the title page:  
In Item (73); Assignee  
change "Fujitsu, Limited, Kawasaki (JP)" to be -- Fujitsu Limited, Kawasaki (JP) --

Signed and Sealed this

Nineteenth Day of December, 2006

JON W. DUDAS  
*Director of the United States Patent and Trademark Office*